(12) United States Patent
Grossi et al.

(10) Patent No.: US 8,325,528 B1
(45) Date of Patent: Dec. 4, 2012

(54) MULTI-LAYER FLASH MEMORY

(75) Inventors: Alessandro Grossi, Milan (IT); Anna Maria Conti, Milan (IT); Roberto Gastaldi, Agrate Brianza (IT)

(73) Assignee: Micron Technology, Inc., Boise, ID (US)

( * ) Notice: Subject to any disclaimer, the term of this patent is extended or adjusted under 35 U.S.C. 154(b) by 266 days.

(21) Appl. No.: 12/764,054

(22) Filed: Apr. 20, 2010

(51) Int. Cl.
*G11C 16/00* (2006.01)

(52) U.S. Cl. ............... 365/185.17; 365/63; 365/185.05; 365/185.11

(58) Field of Classification Search .................. None
See application file for complete search history.

(56) References Cited

U.S. PATENT DOCUMENTS

| | | | |
|---|---|---|---|
| 6,879,505 B2 * | 4/2005 | Scheuerlein | 365/51 |
| 7,570,511 B2 * | 8/2009 | Cho et al. | 365/163 |
| 7,843,733 B2 * | 11/2010 | Kim et al. | 365/185.11 |
| 7,924,629 B2 * | 4/2011 | Park et al. | 365/185.28 |
| 7,933,151 B2 * | 4/2011 | Maeda et al. | 365/185.11 |
| 7,940,564 B2 * | 5/2011 | Park et al. | 365/185.05 |
| 8,004,893 B2 * | 8/2011 | Sim et al. | 365/185.05 |
| 8,009,480 B2 * | 8/2011 | Abiko et al. | 365/185.18 |

OTHER PUBLICATIONS

Jung et al "Three Dimensionally Stacked NAND Flash Memory Technology Using Stacking Single Crystal Si Layers on ILD and TANOS Structure for Beyond 30nm Node" 2006 IEEE, pp. 1-4.
Hsu et al "Study of Sub-30nm Thin Film Transistor (TFT) Charge-Trapping (CT) Devices for 3D Nand Flash Application" 2009 IEEE, pp. 27.4.1-27.4.4.
U.S. Appl. No. 12/764,060, filed Apr. 20, 2010, 31 pages.
U.S. Appl. No. 12/764,063, filed Apr. 20, 2010, 27 pages.

* cited by examiner

*Primary Examiner* — Tan T. Nguyen
(74) *Attorney, Agent, or Firm* — Knobbe, Martens, Olson & Bear LLP

(57) ABSTRACT

Subject matter disclosed herein relates to a multi-layer memory, and more particularly to operating same.

19 Claims, 6 Drawing Sheets

MULTI-LAYER FLASH MEMORY

BACKGROUND

1. Field

Subject matter disclosed herein relates to a multi-layer memory, and more particularly to operating same.

2. Information

Memory devices may be employed in many types of electronic equipment, such as computers, cell phones, PDA's, data loggers, games, and navigational gear, for example. Continuing demand for smaller and/or more capable electronic equipment may lead to a desire for smaller, higher density memory devices, which may involve small semiconductor feature sizes that approach lower boundaries associated with material and electronic behavior at atomic or molecular levels. Accordingly, approaches to increase memory density other than decreasing semiconductor feature sizes may involve new configurations, such as three-dimensional memory architecture having multiple layers of memory arrays. Such an approach, however, may involve relatively major design changes to decoder layout and/or circuitry. For example, a row decoder to select among multiple memory array layers may be relatively complex compared to a row decoder for a more familiar two-dimensional memory architecture.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
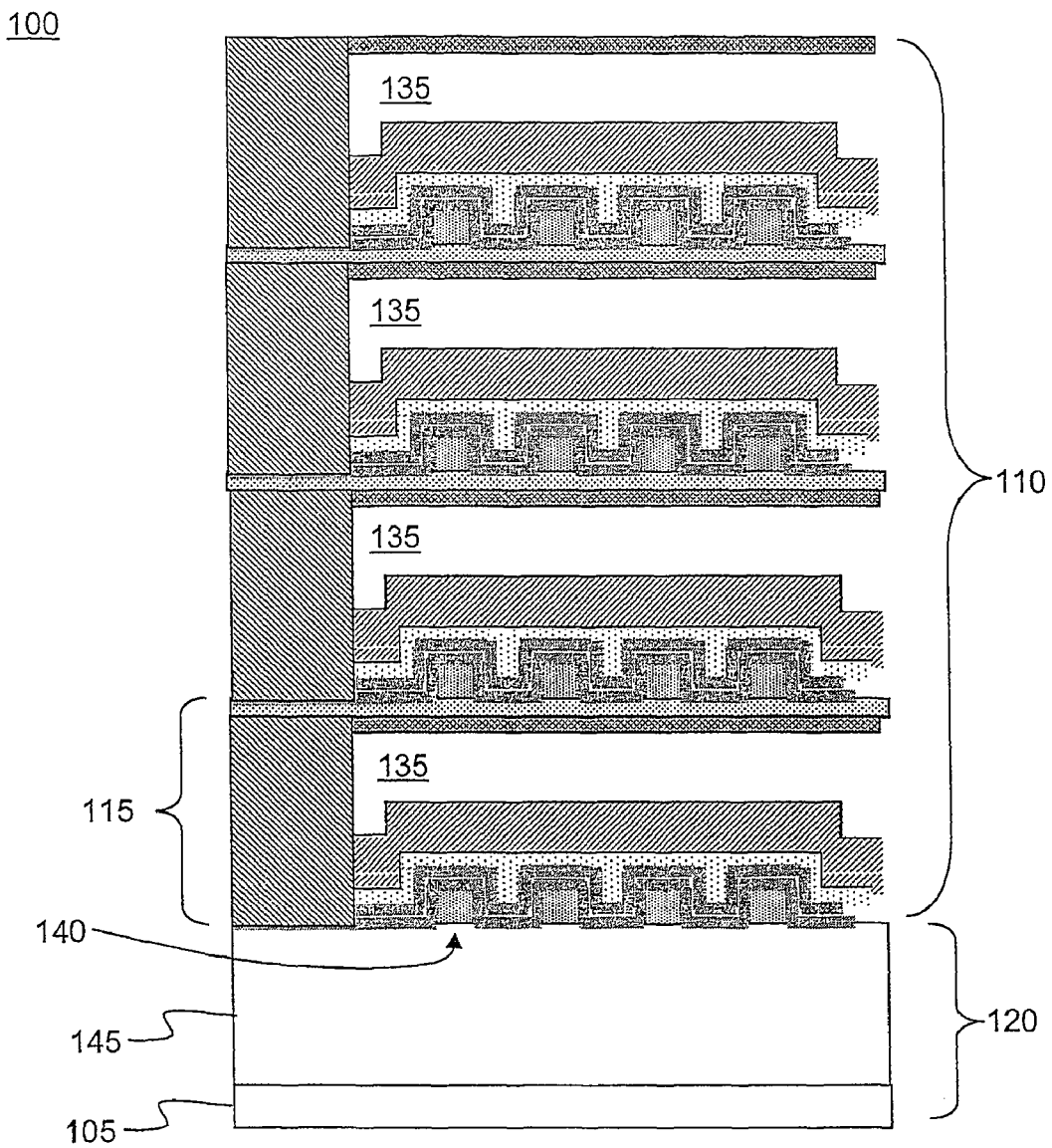
FIG. 1 is a cross-section view of a multi-layer memory device, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a three-dimensional memory structure may comprise two or more memory array layers or levels. Individually, such memory array layers may comprise an array-type architecture similar to that of a two-dimensional memory structure. In one implementation, a single row decoder may be used to select among multiple memory array layers. In such a case, a particular array bias technique may correspond to a particular memory operation, such as read, program, and/or erase. In one implementation, such a three-dimensional memory structure may comprise a NAND flash memory, though claimed subject matter is not limited in this respect. In particular, an array of memory cells may comprise charge trap NAND flash memory cells. Such memory cells may comprise an oxide-nitride-oxide (ONO) stack to selectively trap charge carriers, and a channel region between source/drain regions. Source/drain electrical contact with various layers of memory arrays may comprise a conductive plug extending through the various layers of memory arrays, as explained in further detail below.

In an embodiment, a three-dimensional memory device may include a substrate, peripheral circuitry, and two or more layers of memory cell arrays arranged in blocks. Such blocks may include a plurality of NAND cell strings. Such a NAND cell string may comprise a drain selector transistor, a source selector transistor, and memory cells. Such a structure may also include one or more conductive paths to interconnect corresponding wordlines of two or more layers of memory cell arrays. In one implementation, a common bit line may electrically interconnect drains of drain selector transistors of two or more layers of memory cell arrays. Similarly, a common source line may interconnect sources of source selector transistors of two or more layers of memory cell arrays. Such a common source line may also interconnect NAND cell strings of adjacent blocks.

An ability to use merely a single decoder to select among two or more layers of memory cell arrays may be one of a number of benefits that such a three-dimensional memory device may provide. Such a single decoder may decode a control gate signal of a drain selector transistor of a plurality of NAND cell strings to select an active memory layer among two or more layers of memory cell arrays, for example. Of course, such details of a three-dimensional memory device are merely examples according to a particular implementation, and claimed subject matter is not so limited.

FIG. 1 is a cross-section view of a multi-layer memory device 100, according to an embodiment. Such a three-dimensional memory device may allow relatively high-density packing of memory cells by stacking multiple array layers upon one another. Here, the word "stacking" is not limited to meaning that such memory array layers are formed elsewhere and subsequently placed upon one another. Such memory array layers may also be fabricated in-situ over peripheral circuitry built into a substrate. In a particular implementation, a lower portion 120 of memory device 100 may comprise an interlayer dielectric (ILD) 145 that may provide electrical isolation between substrate 105 and memory array stack 110. In particular, memory array stack 110 may comprise one or more memory array layers 115 that include an array of memory cells 140, source select transistors, and/or drain select transistors, for example. Adjacent memory array layers 115 may be insulated and/or separated from one another by at least ILD 135, though other materials and/or layers may be used. Of course, such a particular configuration is merely an example, and claimed subject matter is not so limited.

Figure 2:
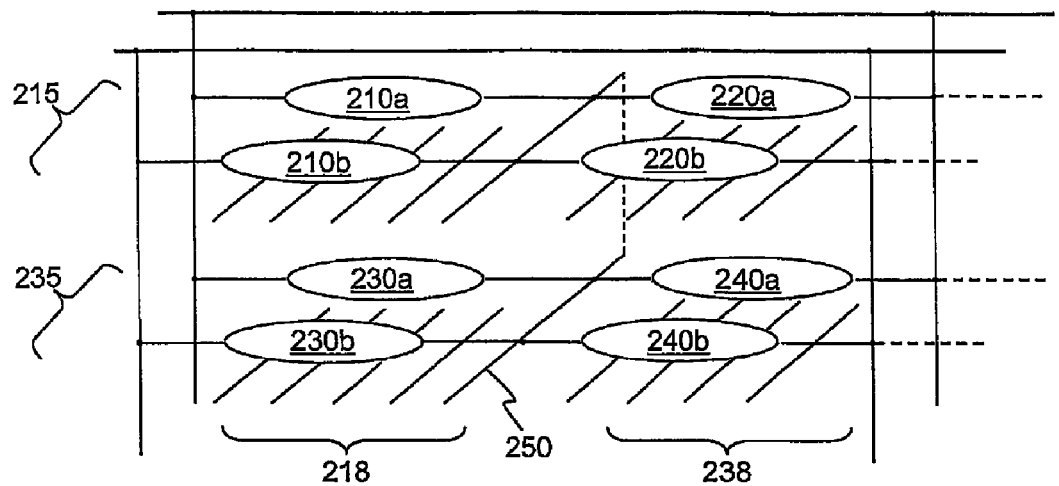
FIG. 2 is a perspective schematic view of a multi-layer memory device, according to an embodiment.

FIG. 2 is a perspective schematic view of a multi-layer memory device 200, according to an embodiment. Such a view is intended to show a general three-dimensional layout and/or positioning of memory arrays. Such a device may comprise a plurality of NAND strings. For sake of clarity, merely a few ovals representing NAND strings are shown, though the number of such NAND strings in a multi-layer memory device may exceed one million, for example. Such a NAND string may comprise a serially-connected drain selector transistor, a plurality of NAND memory cells, and a source selector transistor. NAND strings may be arranged in a hierarchy of rows, layers, and/or blocks. For example, a first layer 235 may comprise NAND strings 230a, 230b, 240a, and 240b, while a second layer 215 may comprise NAND strings 210a, 210b, 220a, and 220b. Continuing, a first block 218 may comprise NAND strings 230a, 230b, 210a, and 210b, while a second block 238 may comprise NAND strings 240a, 240b, 220a, and 220b. Additionally, NAND strings in particular positions in different layers may correspond to one another. For example, NAND string 210b in second layer 215 may correspond to NAND string 230b in first layer 235 and any other NAND string in the same row and block in additional layers (not shown). As another example, NAND string 220a in second layer 215 may correspond to NAND string 240a in first layer 235 and any other NAND string in the same row and block in additional layers. A common source line 250 may connect sources of source selector transistors of NAND strings in adjacent blocks, as described in further detail below. Of course, such details of a configuration for a multi-layer memory device are merely examples, and claimed subject matter is not so limited.

Figure 3:
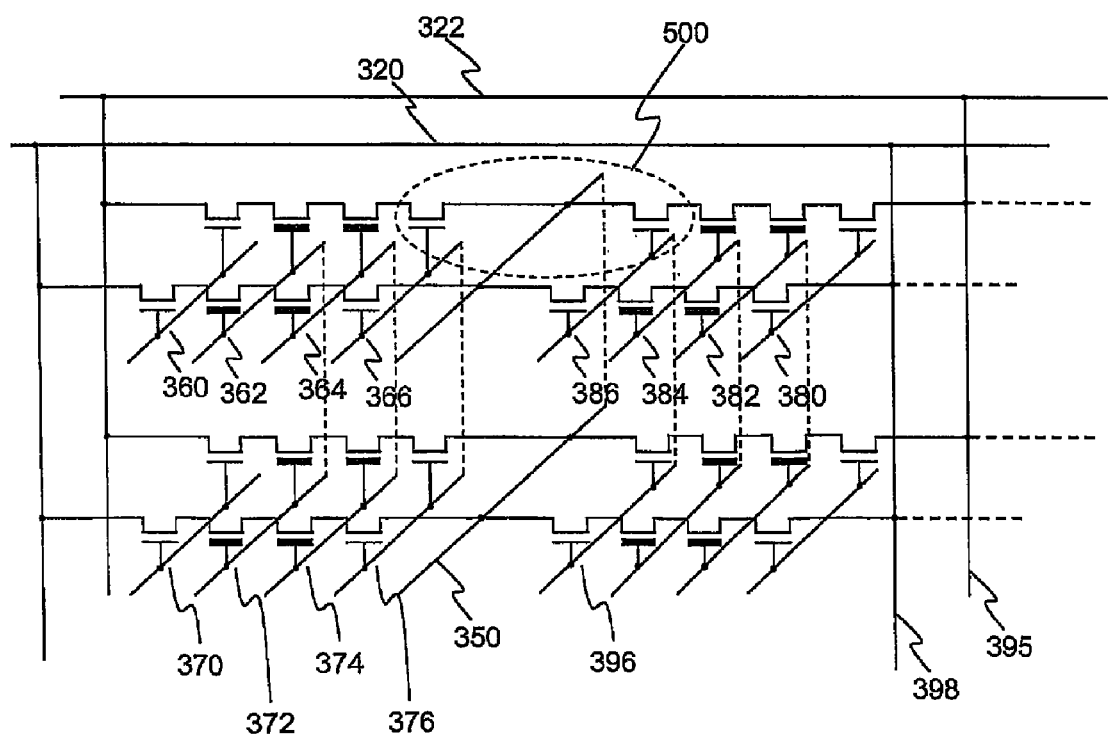
FIG. 3 is a perspective circuit diagram of a multi-layer memory device, according to another embodiment.

FIG. 3 is a perspective circuit diagram of a multi-layer memory device 300, according to an embodiment. Just to list a few examples, a NAND string in a first layer may comprise a drain selector transistor 360, a plurality of NAND memory cells 362 and 364, and a source selector transistor 366. A corresponding NAND string in a second layer may comprise a drain selector transistor 370, a plurality of NAND memory cells 372 and 374, and a source selector transistor 376. Accordingly, memory cells 362 and 372 may comprise mutually corresponding NAND memory cells while memory cells 364 and 374 may comprise other mutually corresponding NAND memory cells. In an implementation, control gates of such corresponding memory cells within a block may be electrically interconnected. Similarly, control gates of corresponding source selector transistors within a block may be electrically interconnected. A common source line 350 may electrically connect sources of source selector transistors of NAND strings in adjacent blocks. For example, a source side of source selector transistor 366 may be electrically connected to a source side of source selector transistors 376, 386, and 396 via common source line 350. Accordingly, common source line 350 electrically interconnects NAND strings of adjacent blocks. NAND strings of corresponding rows on multiple layers may be electrically interconnected to common bit lines. For example, the NAND string that includes source selector transistor 366 may be interconnected to row-corresponding NAND strings that include source selector transistors 376, 386, and 396 via common bit lines 398 and 395. Such common bit lines may then be electrically connected by global bit lines 320, whereas global bit line 322 may electrically interconnect common bit lines associated with NAND strings in another row. In one implementation, control gate signals of drain selector transistors may be decoded to select a particular active memory array layer among multiple memory array layers. Such control gate signals may be responsive to commands received from a memory controller (not shown) and/or commands generated in multi-layer memory device 300. Of course, details of such interconnections are merely examples, and claimed subject matter is not so limited.

Figure 4:
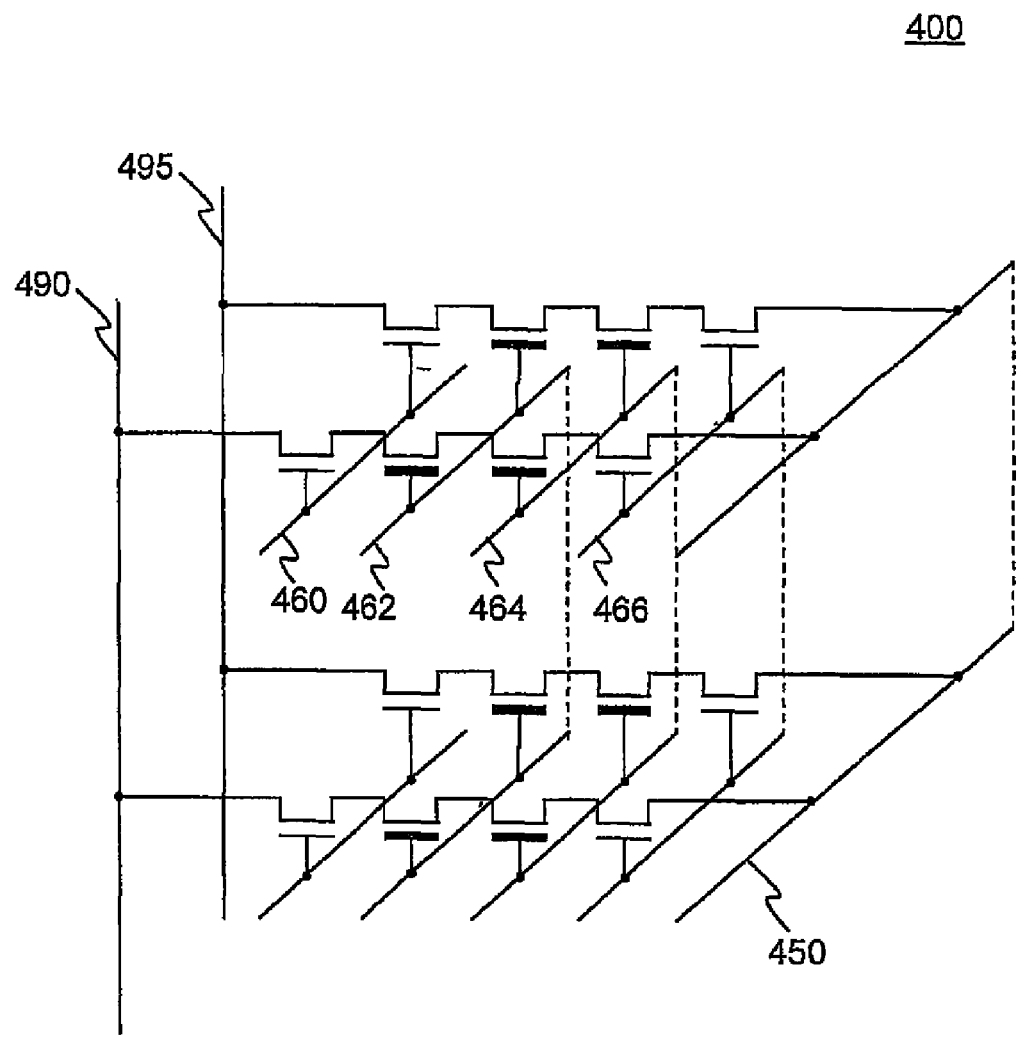
FIG. 4 is a perspective circuit diagram of a block of a multi-layer memory device, according to another embodiment.

FIG. 4 is a perspective circuit diagram of a portion 400 of a memory block of a multi-layer memory device, according to an embodiment. As discussed above, a drain side of drain select transistors of NAND strings may be interconnected via common bit lines 490 and 495. Also, drain select transistor line 460 may electrically interconnect control gates of drain select transistors on a particular memory array layer. Wordlines 462 and 464 may electrically interconnect control gates of corresponding memory cells on multiple layers. Additionally, source select transistor line 466 may electrically interconnect control gates of source select transistors on multiple layers. A common source line 450 may electrically connect sources of source selector transistors of NAND strings on multiple layers.

During a memory array erase operation, particular electrical potentials may be applied to multi-layer memory device 400 in order to erase a block of memory, according to an embodiment. In one implementation, such particular electrical potentials may be responsive to an erase command from a memory controller, for example, requesting access to at least a portion of multi-layer memory device 400. In another implementation, such particular electrical potentials may be responsive to a command generated within multi-layer memory device 400, though claimed subject matter is not so limited. For example, drain select transistor line 460 may electrically float while wordlines 462 and 464 (and other wordlines in a NAND string) may be tied to ground. A bias voltage, ranging from 0 to about 3 volts, for example, may be applied to the gate of source select transistors via source selector transistor line 466. This is in contrast to leaving source selector transistor line 466 floating, as discussed below. Also, an erase voltage of 20 volts may be applied to common source line 450, for example. In particular, such an erase voltage is applied to the source of NAND strings instead of to a substrate of multi-layer memory device 400. Avoiding the use of the substrate in this fashion may be a result of the fact that there may be no substrate that is common to the multiple memory array layers built upon one another. Of course, such details of an erase operation are merely examples, and claimed subject matter is not so limited.

During a memory array read operation, particular electrical potentials may be applied to multi-layer memory device 400 in order to read data stored on a block of memory, according to an embodiment. In one implementation, such particular electrical potentials may be responsive to a read command from a memory controller, for example, requesting access to at least a portion of multi-layer memory device 400. For example, for a selected NAND string, drain select transistor line 460 may be tied to a power supply voltage Vcc while wordlines 462 and 464 (and other wordlines in a NAND string) may be tied to ground. Vcc may also be applied to the gate of source select transistors via source selector transistor line 466. Also, ground voltage may be applied to common source line 450, for example. Bit line 490 or 495 (depending, at least in part, on which NAND string is selected) may be held at a relatively convenient reading voltage. For example Vcc may comprise values in a range of about 1.8 to 3 volts, while a relatively convenient reading voltage may comprise about 1 volt. On the other hand, for an unselected NAND string, drain select transistor line 460 may be tied to ground while wordlines 462 and 464 (and other wordlines in a NAND string corresponding to unselected cells in the string) may be held at Vpass, which may comprise a voltage that allows current to flow through a memory cell independent of the cell state. Meanwhile, a wordline corresponding to a selected cell in the NAND string may be held to ground, for example. Vcc may also be applied to the gate of source select transistors via source selector transistor line 466. Also, ground voltage may be applied to common source line 450, for example. Bit line 490 or 495 (depending, at least in part, on which NAND string is selected) may be held at ground. Of course, such details of a read operation are merely examples, and claimed subject matter is not so limited.

During a memory array program (write) operation, particular electrical potentials may be applied to multi-layer memory device 400 in order to store data on a block of memory, according to an embodiment. In one implementation, such particular electrical potentials may be responsive to a program command from a memory controller, for example, requesting access to at least a portion of multi-layer memory device 400. For example, for a selected NAND string, drain select transistor line 460 may be tied to Vcc while wordlines 462 and 464 (and other wordlines in a NAND string) may be tied to a program voltage. A ground voltage may be applied to the gate of source select transistors via source selector transistor line 466. Also, ground voltage may be applied to common source line 450, for example. Bit line 490 or 495 (depending, at least in part, on which NAND string is selected) may be held at a ground voltage. On the other hand, for an unselected NAND string, drain select transistor line 460 may be tied to ground while wordlines 462 and 464 (and other wordlines in a NAND string) are held at voltage value Vinhibit (where Vinhibit may comprise a voltage that inhibits memory cells from being programmed). A ground voltage may also be applied to the gate of source select transistors via source selector transistor line 466. Also, ground voltage may be applied to common source line 450, for example. Bit line 490 or 495 (depending, at least in part, on which NAND string is selected) may be held at Vcc.

In a particular embodiment, a particular pre-charge technique may be performed for multi-layer memory device 400 in order to deselect memory array layers except a particular memory array layer that is to be programmed, for example. Such a technique may begin by driving bit-lines to Vcc and drain selector transistors of the memory array layers to an ON state to enable voltage transfer to the substrate of respective NAND strings. Next, drain selector transistors except those belonging to the memory array layer which is to be programmed may be driven OFF, while bit-lines to be programmed may be driven to ground. In such a fashion, merely the particular memory array layer may be programmed, while other memory array layers may not be programmed. Of course, such details of a program operation are merely examples, and claimed subject matter is not so limited.

Figure 5:
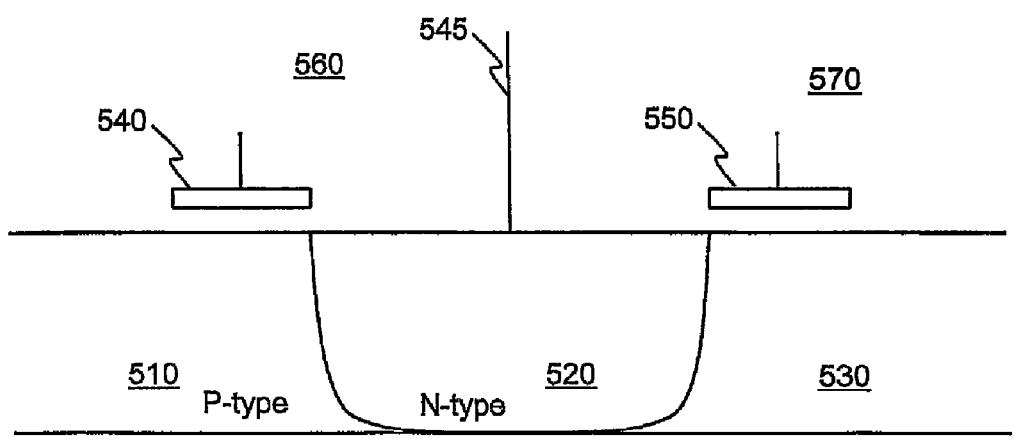
FIG. 5 is a cross-section view of two adjacent NAND strings in a source region, according to an embodiment.

FIG. 5 is a cross-section view of two adjacent NAND strings each in two adjacent blocks, according to an embodiment. For example, such a view may comprise portion 500 shown in FIG. 3, for example. Block 560 and block 570 may be formed in p-type substrate regions 510 and 530, respectively. In a particular implementation, a source terminal 545 may be connected to an n-type well 520. Voltages on source selector transistor gates 540 and 550 may be adjusted to at least partially control a flow of charge carriers across portions of the substrate. For example, during an erase operation electrons may flow from a storage layer to a source terminal, through a reverse biased source/substrate junction, while an equivalent flow of holes may sustain a relatively high voltage involved in erasing p-type substrate region 510 and 530. A generation rate of such holes may be at least partially controlled by a bias voltage of source selector transistor gates 540 and 550. For example, the lower the bias voltage, the higher may be the generation rate resulting in a faster erasing process. On the other hand, the lower the bias voltage, the higher may be a stress that may be applied to oxides of source selector transistor gates 540 and 550. Accordingly, bias voltage may be selected in view of a compromise between desired erase speed and reliability.

Figure 6:
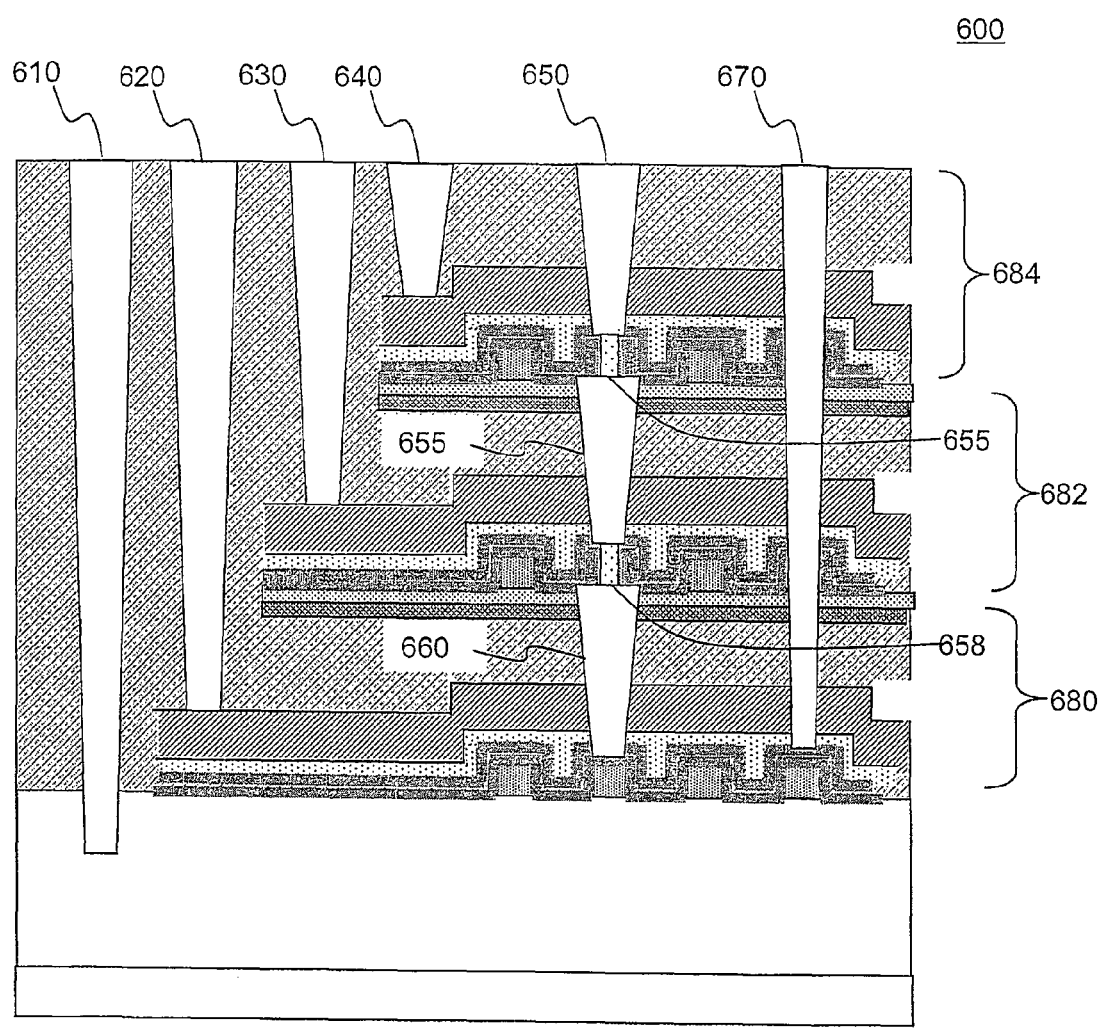
FIG. 6 is a cross-section view of drain or source contacts in a multi-layer memory array, according to an embodiment.

FIG. 6 is a cross-section view of multi-layer memory structure 600 showing a variety of contacts, according to a number of embodiments. Such contacts may provide electrical connections among one or more layers of memory arrays, peripheral circuitry, and/or external circuitry such as a memory controller. For example, such contacts may include bit lines 398 and 395, common bit lines 490 and 495, wordlines 462 and 464, and/or common source line 450, as shown in FIG. 4. In one implementation, periphery contacts 610, 620, 630, and 640 may comprise plugs of a conductive material such as a metal. For example, such periphery contacts may comprise tungsten to electrically connect a peripheral region of a memory array layer to external circuitry (not shown). In particular, contact 620 may electrically connect to a peripheral region of memory array layer 680, contact 630 may electrically connect to a peripheral region of memory array layer 682, and contact 640 may electrically connect to a peripheral region of memory array layer 684. In addition, contact 610 may electrically connect to various conductive lines and/or contact pads leading to external circuitry, for example. A technique to construct such contacts may involve an oxide-only etch process while selecting a proper etch depth in order to reach a particular memory array layer. Subsequent to removing oxide by etching, resulting holes may be filled with a metal after which a CMP process may be performed, for example.

In another implementation, a contact that extends beyond more than one memory array layer may comprise a plurality of inter-layer contacts that connect with one another via conductive plugs. Such contacts may comprise drain contacts, for example, though claimed subject matter is not so limited. In a particular example, external circuitry (not shown) may connect to memory array layer 680 via inter-layer contacts 650, 655, and 660 and conductive plugs 653 and 658. A technique to construct such piece-wise contacts may involve a drain contact etch and fill process for individual memory array layers, adding a conductive plug, and subsequently performing a planarization process (e.g., CMP). Thus, for example, inter-layer contact 660 may be formed after forming memory cell array layer 680 but before forming memory cell array layer 682.

Conductive plug 658 may be formed while forming memory cell array layer 682 or just before forming inter-layer contact 655. Similarly, inter-layer contact 655 may be formed after forming memory cell array layer 682 but before forming memory cell array layer 684, and so on.

In still another implementation, a contact that extends beyond more than one memory array layer may comprise a single plug 670 that extends from a topmost memory cell array layer to a bottommost memory cell array layer. Plug 670 may comprise a drain contact for example. The relatively high aspect ratio inherent with single plug 670 may introduce difficulties with etching and/or filling. Additionally, overlay management across multiple memory cell array layers may introduce difficulties for forming single plug 670. For example, it may be difficult to align a mask on a surface above memory cell array layer 684 with a memory cell feature on memory cell array layer 680. In one embodiment, such a single plug 670 may be used if source and/or drain selectors are to be decoded separately. For example, corresponding bit lines (e.g., poly pattern 720) of respective memory array layers may be electrically shorted with one another. Similarly, corresponding wordlines of respective memory array layers may also be electrically shorted with one another. Of course, such contacts described above are merely examples, and claimed subject matter is not so limited.

Figure 7:
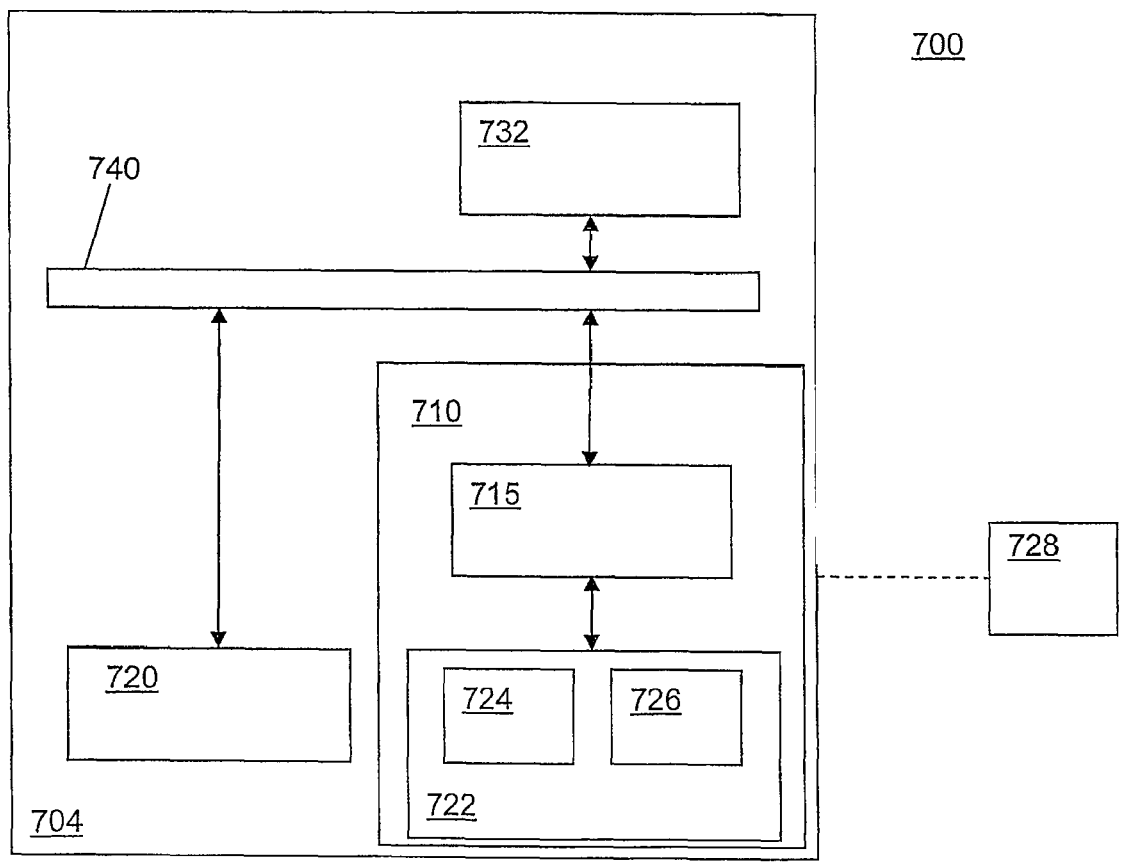
FIG. 7 is a schematic view of a computing system and a memory device, according to an embodiment.

FIG. 7 is a schematic view of a computing system and a memory device, according to an embodiment. Such a computing device may comprise one or more processors, for example, to execute an application and/or other code. For example, memory device 710 may comprise a multi-layer memory device 100 shown in FIG. 1. A computing device 704 may be representative of any device, appliance, or machine that may be configurable to manage memory device 710. Memory device 710 may include a memory controller 715 and a memory 722. By way of example but not limitation, computing device 704 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or associated service provider capability, such as, e.g., a database or data storage service provider/system; and/or any combination thereof.

It is recognized that all or part of the various devices shown in system 700, and the processes and methods as further described herein, may be implemented using or otherwise including hardware, firmware, software, or any combination thereof. Thus, by way of example but not limitation, computing device 704 may include at least one processing unit 720 that is operatively coupled to memory 722 through a bus 740 and a host or memory controller 715. Processing unit 720 is representative of one or more circuits configurable to perform at least a portion of a data computing procedure or process. By way of example but not limitation, processing unit 720 may include one or more processors, controllers, microprocessors, microcontrollers, application specific integrated circuits, digital signal processors, programmable logic devices, field programmable gate arrays, and the like, or any combination thereof. Processing unit 720 may include an operating system configured to communicate with memory controller 715. Such an operating system may, for example, generate commands to be sent to memory controller 715 over bus 740. Such commands may comprise read and/or write commands. In response to a write command, for example, memory controller 715 may provide a bias signal, such as a set or reset pulse to write information associated with the write command to a memory partition, for example. In an implementation, memory controller 715 may operate memory device 710, wherein processing unit 720 may host one or more applications and/or initiate write commands to the memory controller to provide access to memory cells in memory device 710, for example.

Memory 722 is representative of any data storage mechanism. Memory 722 may include, for example, a primary memory 724 and/or a secondary memory 726. Primary memory 724 may include, for example, a random access memory, read only memory, etc. While illustrated in this example as being separate from processing unit 720, it should be understood that all or part of primary memory 724 may be provided within or otherwise co-located/coupled with processing unit 720.

Secondary memory 726 may include, for example, the same or similar type of memory as primary memory and/or one or more data storage devices or systems, such as, for example, a disk drive, an optical disc drive, a tape drive, a solid state memory drive, etc. In certain implementations, secondary memory 726 may be operatively receptive of, or otherwise configurable to couple to, a computer-readable medium 728. Computer-readable medium 728 may include, for example, any medium that can carry and/or make accessible data, code, and/or instructions for one or more of the devices in system 700.

Computing device 704 may include, for example, an input/output 732. Input/output 732 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 732 may include an operatively configured display, speaker, keyboard, mouse, trackball, touch screen, data port, etc.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A memory device comprising:
    a multi-layer memory cell array structure comprising two or more layers of memory cell arrays, wherein at least one wordline of a first one of said layers is interconnected with at least one wordline of a second one of said layers to enable access of memory cells on either of said first or second layers responsive to electronic signals generated by decoding a command;
    a common bit line interconnecting drains of drain selector transistors on said two or more layers of memory cell arrays, said common bit line to carry said electronic signals generated by decoding said command; and
    a common source line interconnecting gates of the source selector transistors on said two or more layers of memory cells array.

2. The memory device of claim 1, wherein said at least one wordline of said first one of said layers and said at least one wordline of said second one of said layers are coupled to gates of corresponding memory cells in a single memory block.

3. The memory device of claim 1, wherein said command comprises a request to access a particular one of said two or more layers of memory cell arrays.

4. The memory device of claim 1, wherein said two or more layers of memory cell arrays comprise NAND cell strings that include said drain selector transistors, a source selector transistors, and said memory cells.

5. The memory device of claim 4, further comprising:
    a common source line interconnecting sources of said source selector transistors on said at least two of said two or more layers of memory cell arrays.

6. The memory device of claim 5, wherein said common source line interconnects said NAND cell strings of adjacent memory blocks.

7. The memory device of claim 5, further comprising a single decoder capable of decoding a control gate signal of said drain selector transistor of said plurality of NAND cell strings to select an active memory layer among said two or more layers of memory cell arrays.

8. The memory device of claim 4, further comprising:
    one or more conductive paths to connect a control gate of said source selector transistor of one NAND cell string to control gates of other source selector transistors of other NAND cell strings in a particular memory block.

9. The memory device of claim 1, wherein said memory cells comprise charge trap NAND memory cells.

10. A method comprising:
receiving a memory address associated with a command;
applying a particular voltage to at least two interconnected gates of memory cells on different layers among two or more layers of memory cell arrays, wherein said particular voltage is based, at least in part, on said command; and
applying a particular source line voltage to a common source line that interconnects sources of source selector transistors on respective layers of said two or more layers of memory cell arrays, wherein said particular source line voltage is based, at least in part, on said command.

11. The method of claim 10, further comprising:
decoding a control gate signal of drain selector transistors connected to said memory cells, wherein said control gate signal is based, at least in part, on said memory address.

12. The method of claim 11, further comprising:
applying a particular bit line voltage to a common bit line that interconnects drains of said drain selector transistors on respective layers of said two or more layers of memory cell arrays, wherein said particular bit line voltage is based, at least in part, on said command.

13. The method of claim 11, wherein a control gate of said source selector transistor of one NAND cell string is electrically connected to control gates of other source selector transistors of other NAND cell strings in a particular memory block.

14. The method of claim 11, wherein said command comprises an erase command, the method further comprising:
applying an erase bias voltage via said common source line.

15. The method of claim 10, wherein said memory cells comprise charge trap NAND memory cells.

16. A system comprising:
a memory controller to operate a memory device, said memory device comprising:
a multi-layer memory cell array structure comprising two or more layers of memory cell arrays, wherein at least one wordline of a first one of said layers is interconnected with at least one wordline of a second one of said layers to enable access of memory cells on either of said first or second layers responsive to electronic signals generated by decoding a command;
a common bit line interconnecting drains of drain selector transistors on said two or more layers of memory cell arrays, said common bit line to carry said electronic signals generated by decoding said command; and
a common source line interconnecting gates of source selector transistors on said two or more layers of memory cells array; and
a processor to host one or more applications and to initiate said command to said memory controller to provide access to said memory cells in said memory cell arrays.

17. The system of claim 16, wherein said memory device further comprises:
a common source line interconnecting sources of source selector transistors of said two or more layers of memory cell arrays.

18. The system of claim 17, wherein said memory device further comprises memory blocks that are electrically interconnected by said common source line.

19. The system of claim 17, wherein said two or more layers of memory cell arrays are partitioned into two or more memory blocks that are electrically connected via said common source line.

* * * * *